United States Patent
Kanetani et al.

(10) Patent No.: US 6,807,115 B2
(45) Date of Patent: Oct. 19, 2004

(54) METHOD OF TESTING A SEMICONDUCTOR INTEGRATED DEVICE

(75) Inventors: Kazuo Kanetani, Akishima (JP); Hiroaki Nambu, Sagamihara (JP); Kaname Yamasaki, Kokubunji (JP); Fumihiko Arakawa, Tokorozawa (JP); Takeshi Kusunoki, Tachikawa (JP); Keiichi Higeta, Hamura (JP)

(73) Assignees: Renesas Technology Corporation, Tokyo (JP); Hitachi Device Engineering Co., Ltd., Chiba (JP)

( * ) Notice: Subject to any disclaimer, the term of this patent is extended or adjusted under 35 U.S.C. 154(b) by 3 days.

(21) Appl. No.: 10/360,867

(22) Filed: Feb. 10, 2003

(65) Prior Publication Data

US 2003/0123309 A1 Jul. 3, 2003

Related U.S. Application Data

(62) Division of application No. 10/013,474, filed on Dec. 13, 2001, now Pat. No. 6,617,610.

(30) Foreign Application Priority Data

Jan. 22, 2001 (JP) ........................................ 2001-012607

(51) Int. Cl.$^7$ ................................................. G11C 7/00
(52) U.S. Cl. .................... 365/201; 365/189.09; 365/233
(58) Field of Search ............................ 365/201, 189.09, 365/233

(56) References Cited

U.S. PATENT DOCUMENTS

| 5,270,977 | A | | 12/1993 | Iwamoto et al. ............. 365/201 |
| 5,808,961 | A | * | 9/1998 | Sawada ....................... 365/233 |
| 6,125,462 | A | * | 9/2000 | Sato ............................ 714/724 |
| 6,295,238 | B1 | * | 9/2001 | Tanizaki et al. ............. 365/201 |
| 6,489,819 | B1 | * | 12/2002 | Kono et al. .................. 327/141 |
| 6,614,713 | B2 | * | 9/2003 | Tanizaki et al. ............. 365/233 |

FOREIGN PATENT DOCUMENTS

JP  10-214133  12/1997

* cited by examiner

*Primary Examiner*—Vu A. Le
*Assistant Examiner*—Tuan T. Nguyen
(74) *Attorney, Agent, or Firm*—Reed Smith LLP; Stanley P. Fisher, Esq.; Juan Carlos A. Marquez, Esq.

(57) ABSTRACT

In a dynamic-type semiconductor integrated circuit in which precharge and evaluation operations are preformed per cycle, an IDDQ test and a light detection test can be conducted during an evaluation period for facilitating diagnosis and failure analysis so as to increase test accuracy. The dynamic-type semiconductor integrated circuit operates in a normal operation mode or a test mode, wherein a switch therebetween is triggered by a mode selection signal. In the normal operation mode, the pulse width of an internal activation signal is controlled to be constant, i.e., invariable with an operation cycle time length. In the test mode, the pulse width of the internal activation signal is controlled to vary according to an operation cycle time length.

3 Claims, 15 Drawing Sheets

NORMAL OPERATION MODE (SHORT CYCLE TIME)
tc1/2<td<tc1

CLOCK THROUGH MODE (LONG CYCLE TIME) td<tc2/2

NORMAL OPERATION (SHORT CYCLE TIME)

CLOCK THROUGH MODE (LONG CYCLE TIME)

METHOD OF TESTING A SEMICONDUCTOR INTEGRATED DEVICE

This application is a divisional application of U.S. application Ser. No. 10/013,474 filed on Dec. 13, 2001, now U.S. Pat. No. 6,617,610.

BACKGROUND OF THE INVENTION

1. Field of the Invention

The present invention relates to a semiconductor integrated circuit and semiconductor memory circuit suitable for facilitating a diagnostic test for product inspection by changing a pulse width and a timing sequence of an internal activation signal which controls the active/inactive operations of an internal circuit.

2. Description of the Related Art

A dynamic-type semiconductor integrated circuit has an internal circuit controlled by an internal activation signal (hereinafter also referred to just as an activation signal). FIG. 24, shows a schematic diagram of a conventional dynamic-type semiconductor integrated circuit. In FIG. 24, "L1" to "Lm" indicate internal circuits, "CK1" to "CKm" indicate activation signals, and "MPC" indicates an activation signal generator comprising a plurality of pulse control circuits PC1 to PCm. "CKEX" indicates a reference signal, e.g., an external clock signal.

The dynamic-type semiconductor integrated circuit is advantageous over a static-type semiconductor integrated circuit in that a beta ratio of the internal circuits L1 to Lm (a ratio of a beta factor of a P-type MOS transistor to a beta factor of an N-type MOS transistor) is increased, such as by a higher-speed operation. In a static semiconductor memory cell and a current-mirror sense amplifier, power is consumed only during an active period, i.e., no power is consumed during an inactive period. This feature provides an advantage of reducing power consumption.

FIG. 25 shows a detailed arrangement of the activation signal generator MPC in a conventional dynamic-type semiconductor integrated circuit. In FIG. 25, "MPC" indicates the entire activation signal generator, and "PC1" indicates a pulse width shortener for keeping the pulse widths of the activation signals CK1 to CKm constant. The pulse width shortener PC1 comprises a delay circuit DL10 and a NOR circuit N10. In the pulse control circuit PC2, there are delay circuits DL20 and DL21, and in the pulse control circuit PCm, there is a delay circuit DLm. The activation signals CK1 to CKm are generated with reference to the external clock signal CKEX. On a signal line S10 in the activation signal generator MPC, the polarity of the external clock signal CKEX is reversed. A test mode signal TM and an external input signal EXT are explained later.

FIG. 26 shows a timing chart of the external clock signal CKEX and other signals. Through the pulse width shortener PC1, the activation signal CK1 is a signal which goes to a high potential level only when both the external clock signal CKEX and its inverted signal S10 are at a low potential level. In other words, the pulse width (tw1) of the activation signal CK1 is narrower than the pulse width (twck) of the external clock signal CKEX, and the pulse width (tw1) of the activation signal CK1 is constant (i.e., invariable with the time length of an operation cycle since the delay circuit DL10 provides a constant delay time td10). A timing point t2 of the activation signal CK2 is set according to a delay time (td20) of the delay circuit DL20 or a delay time (td21) of the delay circuit DL21, and a timing point tm of the activation signal CKm is set according to a delay time (tdm0) of the delay circuit DLm0.

A diagnostic test (normal operation test, or IDDQ test) and a failure analysis to be performed during a semiconductor integrated circuit inspection are described as follows. In the normal operation test, an output signal resulted from the execution of an input signal sequence is monitored to determine a GOOD/NO GOOD condition. In the IDDQ test, a power supply current is monitored when an internal node is in a completely quiescent state (pause phase), and a GOOD/NO GOOD condition is determined according to the magnitude of the power supply current. Since to the IDDQ test does not require propagating a fault indication in an internal node to an output pin, the IDDQ test is regarded as a rather direct diagnostic test. However, both of the normal operation test and the IDDQ test require carrying out a plurality of input signal sequences for checking all the concerned internal nodes.

Regarding the failure analysis, there is a well-known method in which an output signal of a semiconductor integrated circuit is monitored and analyzed with a logic tester (or memory tester). Alternatively, an internal signal is observed and analyzed with a probe or an electron beam tester. These failure analysis methods, however, require a relatively long time to identify a fault location. Therefore, recently, another failure analysis method called a light detection test, has become popular. In the light detection test, a fault location is identified by detecting the heat caused by a leak current at a fault location. The light detection test is particularly advantageous in that it takes relatively short time to identify a fault location.

Another diagnostic test or failure analysis method employs a technique of externally controlling the timing of activation signals which is disclosed in U.S. Pat. No. 5,270,977. This technique uses the pulse control circuit PC2 of the activation signal generator MPC shown in FIG. 25. The pulse control circuit PC2 is provided with two operation modes: a normal operation mode and a test mode. The switch between these modes is controlled by the test mode signal TM. In the normal operation mode, the delay circuit DL20 is used for controlling of the activation signal CK2. In the test mode, the delay circuit DL21 is used for controlling the timing of the activation signal CK2. The external input terminal EXT of the delay circuit DL21 receives an external signal supplied through an external pin of the semiconductor integrated circuit. In other words, with the external signal supplied from a tester through the external pin, the timing of the activation signal CK2 is adjusted with the tester. This technique, for example, can judge whether or not a malfunction in the normal operation mode is caused by any insufficiency of the timing margin of the activation signal CK2.

In a dynamic-type semiconductor integrated circuit, however, it is difficult to carry out the IDDQ test or the light detection test under the required conditions. More specifically, as shown in the signal timing chart in FIG. 26, the pulse width corresponding to an evaluation period is constant and narrow for each of the activation signals CK1 to CKm. Therefore, during the evaluation period, it is difficult to provide a pause phase of the internal node, which results in an inadequate condition for the IDDQ test. Further, even if there is a leak current fault, there usually is not sufficient heat for identifying the fault location, which makes it impracticable to carry out the light detection test. In contrast, the pulse width corresponding to a precharge period can be widened by increasing the time length of an operation cycle. Therefore, during the precharge period, a pause phase of the internal node can be provided for executing the IDDQ test. For example, immediately before the end of each operation cycle, the IDDQ test is carried out as indicated by the pulse form of an IDDQ signal in FIG. 26. In addition, if a leak current fault occurs during the precharge period, sufficient heat can be attained for identifying a fault location so as to execute the light detection test.

Satisfactory diagnosis cannot be performed in the IDDQ test and the light detection test, since adequate conditions are not provided during the evaluation period as mentioned above, although it is allowed to conduct diagnosis satisfactorily during the precharge period.

Further, in an initial trial production stage process conditions are not yet stable, a margin of timing between an input signal to an internal circuit and an activation signal tends to be insufficient to cause a malfunction, which results in additional complication in identifying a cause and a location of a fault. In other words, it becomes difficult to determine whether the malfunction is caused by an insufficient timing margin or by a leak current in the internal circuit. Therefore, for ensuring satisfactory accuracy in diagnosis, it is also important to eliminate any insufficiency in timing margin.

The U.S. Pat. No. 5,270,977 also discloses a technique for determining whether a malfunction is caused by an insufficient timing margin or not. However, this conventional technique is not designed for the IDDQ test and light detection test in cases where the pulse width of each activation signal is as narrow as noted above.

SUMMARY OF THE INVENTION

It is therefore an object of the present invention to provide a dynamic-type semiconductor integrated circuit wherein an IDDQ test and a light detection test are performed under adequate conditions during an evaluation period for diagnosis and failure analysis with improved accuracy.

In accomplishing this object of the present invention and according to one aspect of the invention, a dynamic-type semiconductor integrated circuit is provided with a normal operation mode and a test mode, wherein the switch therebetween is performed by a mode selection signal. In the normal operation mode, the pulse width of an internal activation signal is controlled to be constant, i.e., invariable with an operation cycle time length. In the test mode, the pulse width of the internal activation signal is controlled to vary depending on an operation cycle time length. Thus, a pause phase of an internal node is provided during an evaluation period so as to carry out satisfactory diagnosis and failure analysis.

The above and other objects, features and advantages of the present invention will become more apparent from the following detailed description with reference to the accompanying drawings.

DETAILED DESCRIPTION OF THE PREFERRED EMBODIMENTS

The present invention will now be described in detail by way of preferred embodiments with reference to the accompanying drawings.

Figure 1:
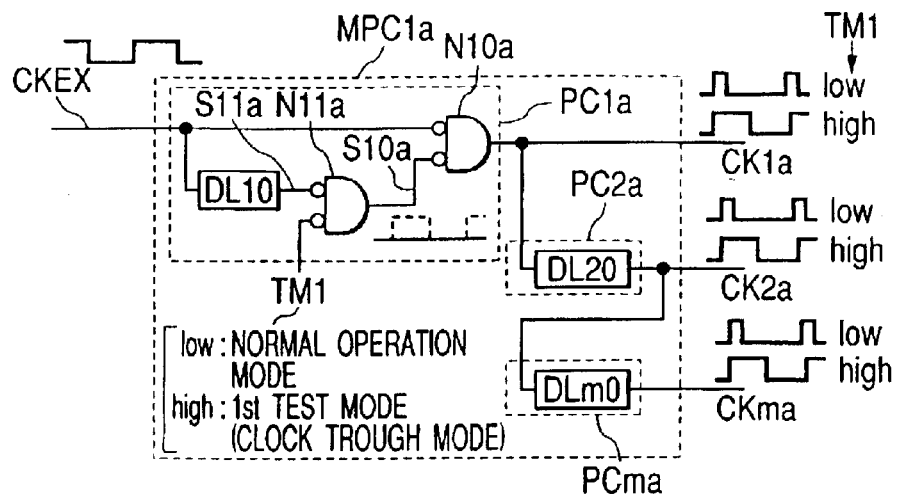
FIG. 1 is logic circuit diagram showing a first preferred embodiment of the present invention.
Figure 25:
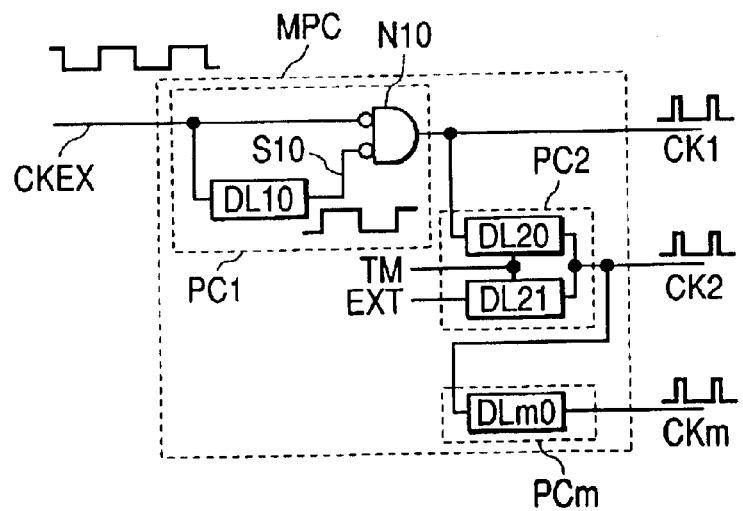
FIG. 25 is a circuit diagram showing pulse control circuits used in the example of the conventional semiconductor integrated circuit.

Embodiment 1:

Referring to FIG. 1, a logic circuit diagram of a first preferred embodiment of the present invention is shown. In lieu of the pulse width shortener PC1 in the exemplary conventional circuit shown in FIG. 25, a pulse width shortener PC1a is provided in the first preferred embodiment of the invention. To simply its configuration, a pulse control circuit PC2a comprises a delay circuit DL20.

The pulse width shortener PC1a in the first preferred embodiment comprises a delay circuit DL10, a NOR circuit N10a, and a NOR circuit N11a disposed therebetween. One input terminal of the NOR circuit N11a receives a signal S11a outputted from the delay circuit DL10, and the other input terminal thereof receives a first test mode signal TM1. When the first test mode signal TM1 has a low potential, a normal operation mode is initiated. When the first test mode signal TM1 has a high potential, a first test mode is initiated.

Figure 26:
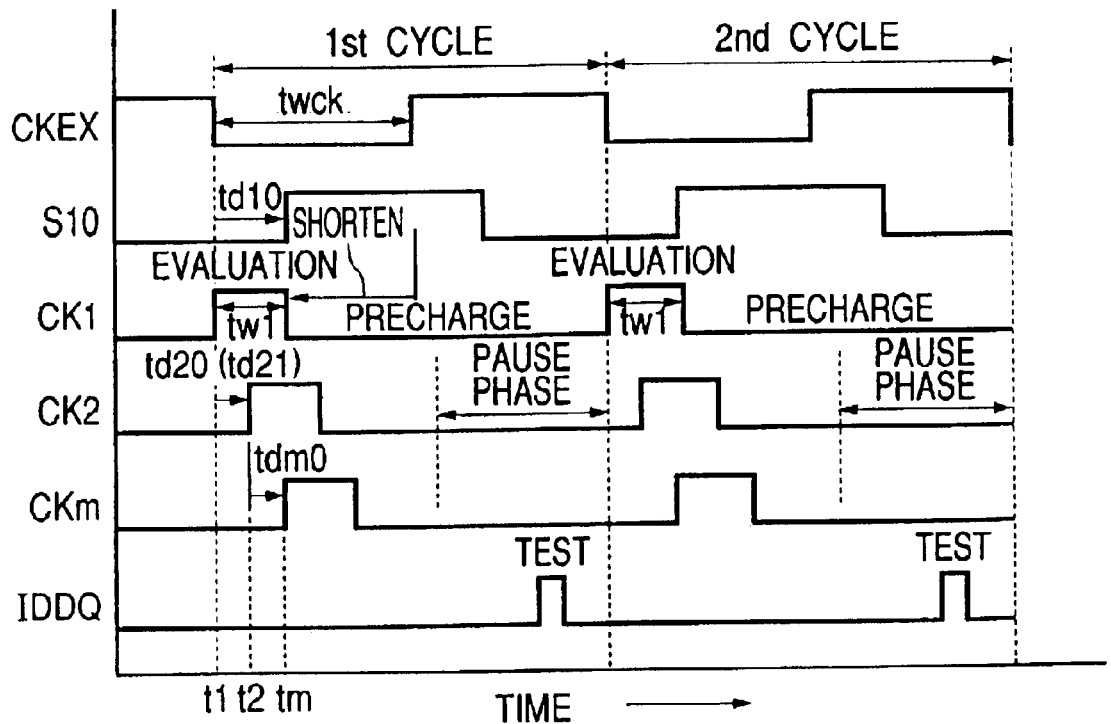
FIG. 26 is a signal timing chart in the example of the conventional semiconductor integrated circuit.

The following describes the normal operation mode and the first test mode respectively. In the normal operation mode, a signal S10a is derived from the signal S11a. Therefore, as in the exemplary conventional circuit shown in FIG. 26, each of activation signals CK1a to CKma is delivered with a shortened pulse width. In the first test mode, the activation signals CK1a to CKma are delivered as shown in the signal timing chart in FIG. 2. More specifically, since the signal S10a is not derived from the signal S11a but remains at a low potential, the activation signals CK1a to CKma are delivered in accordance with an external clock signal CKEX (having a pulse width duty ratio of 50% in this example). (The first test mode is hereinafter also referred to as a "clock through mode".) Therefore, in a case where an operation cycle time is on the order of tens of seconds, for example, an evaluation period (twcka) of each of the activation signals CK1a to CKma is sufficiently long. Therefore, a pause phase of an internal node can be provided during the evaluation period, making it possible to carry out a diagnostic test (an IDDQ test or a light detection test).

Figure 2:
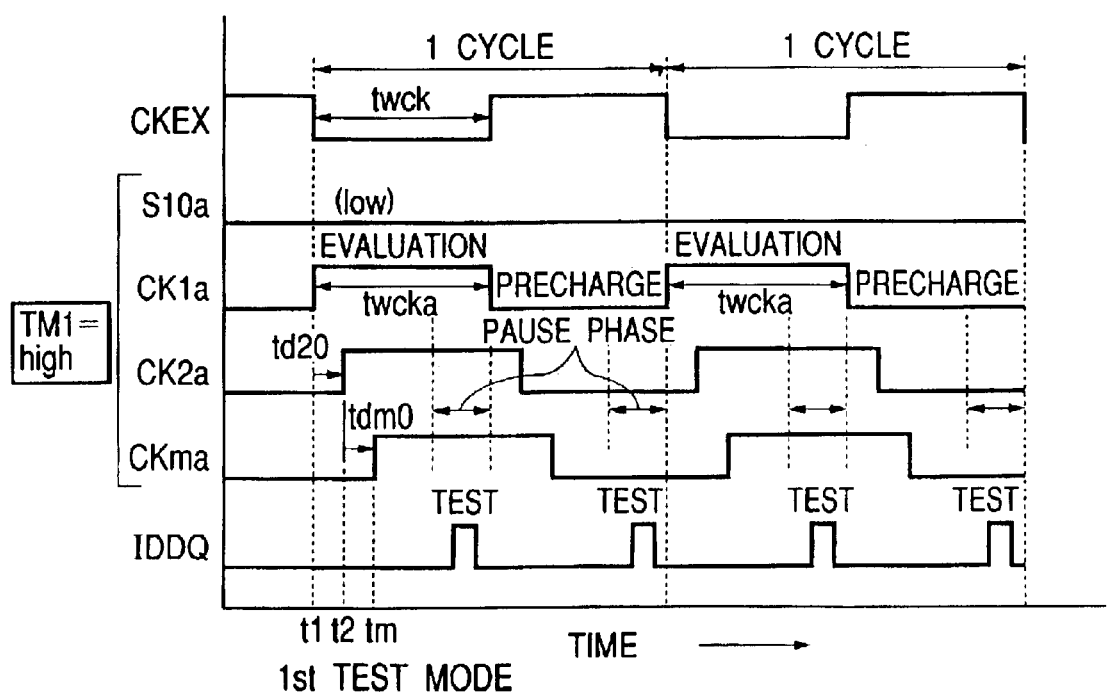
FIG. 2 is a signal timing chart in the first preferred embodiment of the present invention.

For example, as indicated by the pulse form of an IDDQ signal in FIG. 2, a diagnostic test is carried out immediately before the start of precharge. For diagnosis during a precharge period, an IDDQ test is conducted immediately before the start of evaluation with the signal CK1a. Note that timing points t1 to tm of the activation signals CK1a to CKma are the same as in the normal operation mode. It is therefore important to provide a proper timing margin in the normal operation mode.

Figure 3:
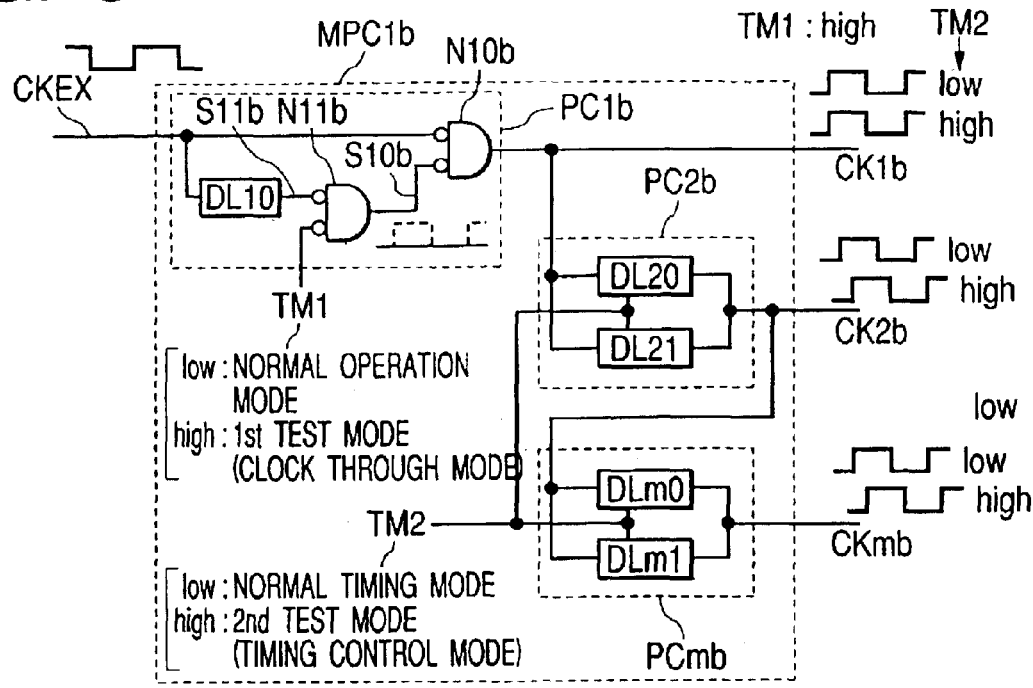
FIG. 3 is a logic circuit diagram showing a second preferred embodiment of the present invention.

Embodiment 2:

In the following example, a diagnostic test is carried out with a sufficient timing margin for each of the activation signals CK1a to CKma. FIG. 3 shows a logic circuit in a second preferred embodiment of the present invention. According to the second preferred embodiment, each of activation signals CK1b to CKmb provides a timing margin wider than that in the normal operation mode of the first preferred embodiment. In lieu of the pulse control circuits PC2a and PCma in the first preferred embodiment shown in FIG. 1, pulse control circuits PC2b and PCmb are provided in the second preferred embodiment. It is noted that a pulse width shortener PC1b in the second preferred embodiment is identical to the pulse width shortener PC1a in the first preferred embodiment.

The pulse control circuit PC2b comprises a signal path extending through a delay circuit DL20 and a signal path extending through a delay circuit DL21 which provides a longer delay time. The pulse control circuit PCmb comprises a signal path extending through a delay circuit DLm0 and a signal path extending through a delay circuit DLm1 which provides a longer delay time. For each of the activation signals CK2b to CKmb, the respective signal path selection is made according to a second test mode signal TM2. When the second test mode signal TM2 is at a low potential, normal timing is set up. When the second test mode signal is at a high potential, delayed timing is set up.

Figure 4:
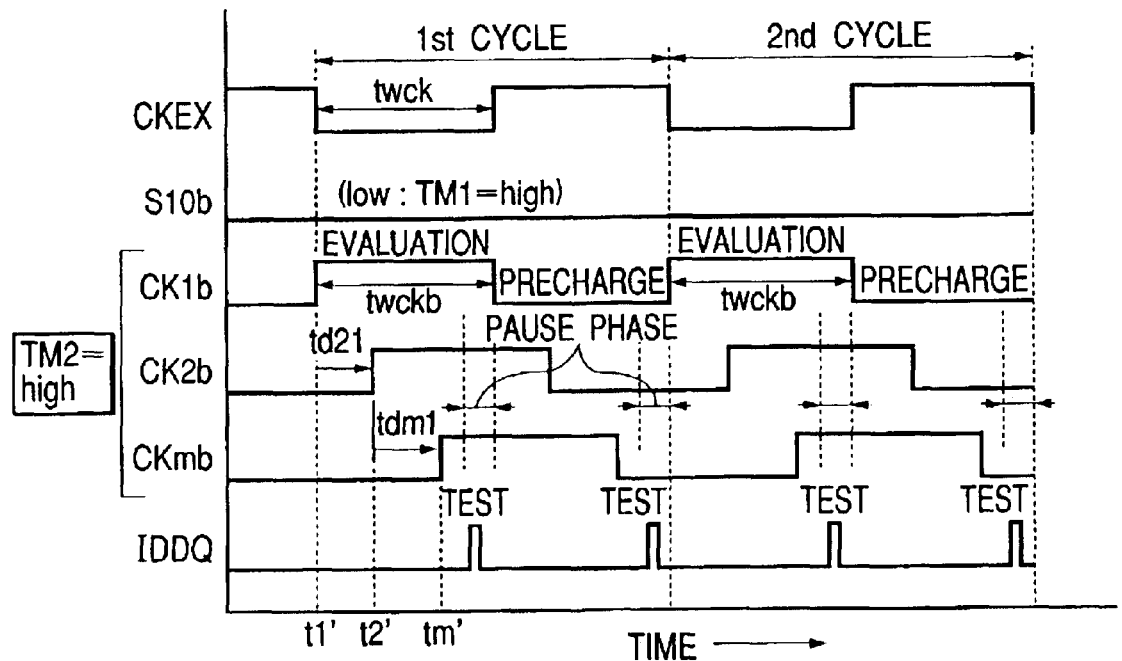
FIG. 4 is a signal timing chart in the second preferred embodiment of the present invention.

More specifically, in a second test mode (hereinafter also referred to as a "timing control mode"), each activation signal is delivered as shown in the signal timing chart in FIG. 4. Explained below is a timing sequence in the timing control mode in comparison with the normal timing points t1 to tm indicated in FIG. 2. A timing point t1' of the activation signal CK1b in the timing control mode is the same as the normal timing point t1, but a timing point t2' of the activation signal CK2b in the timing control mode lags behind the normal timing t2. Hence, a timing margin (t2'-t1') is wider than a timing margin (t2-t1), and a timing margin (tm'-t2') is wider than a timing margin (tm-t2).

Accordingly, by combining the first and second test modes (clock through mode and timing control mode) in the second preferred embodiment, it becomes possible to carry out diagnosis and failure analysis with higher accuracy than the first preferred embodiment. In the second preferred embodiment, a mode switch is made at two steps using the delay circuits DL20 and DL21, for example. It is obvious to those skilled in the art that more than two timing steps can be implemented by increasing the number of delay circuits and the number of second test mode signals TM2.

Further, the pulse width shortener PC1b may be modified to comprise a plurality of delay circuits (DL10) as in the pulse control circuit PC2b and any one of the delay circuits may be selected by a signal, i.e., a third test mode (e.g., TM3). In this modified arrangement, a plurality of timing steps of signals S11b and S10b in the pulse width shortener PC1b are controlled in the normal operation mode, thereby making it possible to regulate the pulse width of each of the activation signals CK1b to CKmb over a range of a plurality of steps (the third test mode serves as a "pulse width control mode").

The following describes third and fourth preferred embodiments in which an activation signal having a pulse width shorter than that of the external clock signal CKEX to be mixed with an activation signal having a non-shortened pulse width.

Figure 5:
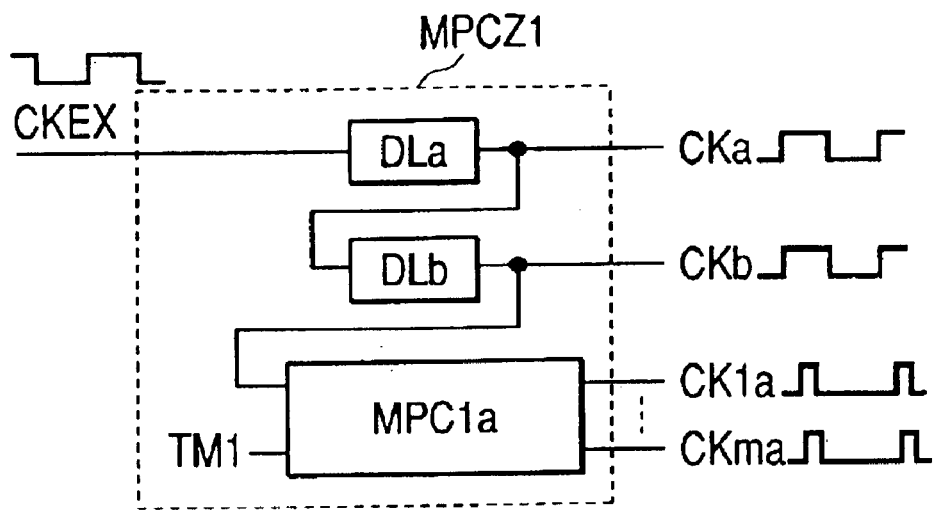
FIG. 5 is a block circuit diagram showing a third preferred embodiment of the present invention.

Embodiment 3:

FIG. 5 shows a block circuit diagram of the third preferred embodiment of the present invention. "MPCZ1" indicates the entire provision of an activation signal generator. Each of activation signals CKa and CKb is derived through delay circuits DLa and DLb, and therefore the pulse width thereof is equal to that of the external clock signal CKEX. The delay circuits DLa and DLb provide fixed timing for the activation signals CKa and CKb. In contrast, the pulse widths of activation signals CK1a to CKma may or may not be made shorter than the pulse width of the external clock signal CKEX under control of the first test mode signal TM1. In other words, when the pulse widths of the activation signals CK1a to CKma are shortened, there occurs a situation in which the activation signals CK1a to CKma each having a pulse width shorter than that of the external clock signal CKEX and the activation signals CKa and CKb each having a pulse width equal to that of the external clock signal CKEX are delivered mixedly. In this case, it is also possible to carry out diagnosis and failure analysis easily with high accuracy in the clock through mode.

Figure 6:
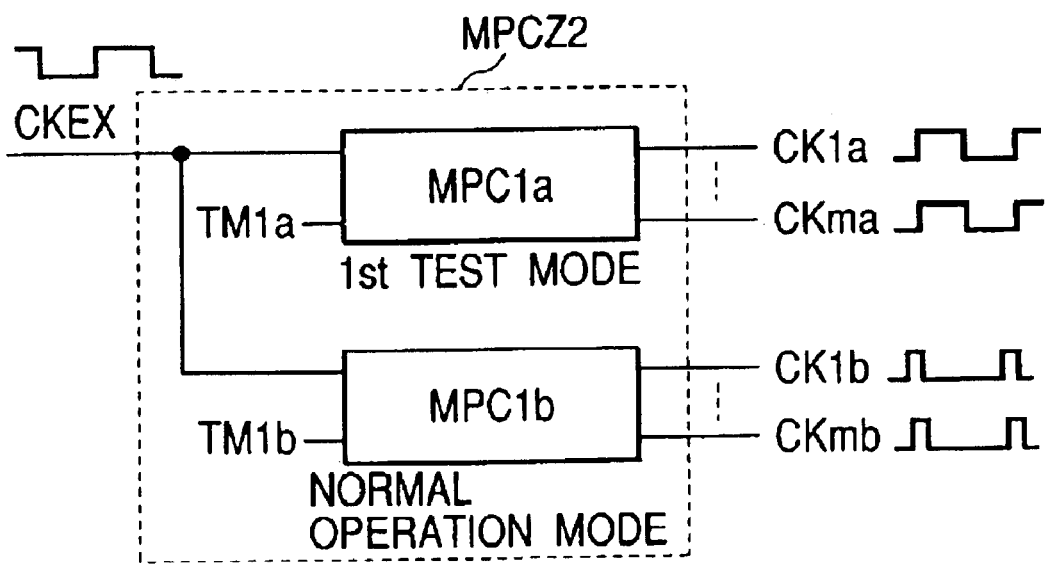
FIG. 6 is a block circuit diagram showing a fourth preferred embodiment of the present invention.

Embodiment 4:

FIG. 6 shows a block circuit diagram of the fourth preferred embodiment of the present invention. "MPCZ2" indicates the entire provision of an activation signal generator. The activation signal generator MPCZ2 comprises activation signal generating circuits MPC1a and MPC1b. In the normal operation mode, the pulse widths of activation signals CK1a to CKma and CK1b to CKmb are made shorter than the pulse width of the external clock signal CKEX. A switch to the clock through mode is performed using first test mode signals TM1a and TM1b. The first test mode signal TM1a is used for a set of the activation signals CK1a to CKma, and the first test mode signal TM1b is used for a set of the activation signals CK1b to CKmb. Thus, only the activation signals CK1a to CKma or only the activation signals CK1b to CKmb can be set to the clock through mode. Accordingly, it can be judged whether a cause of a fault is located in a circuit receiving the activation signals CK1a to CKma or in a circuit receiving the activation signals CK1b to CKmb. This makes it possible to carry out diagnosis and failure analysis easily with high accuracy.

Figure 7:
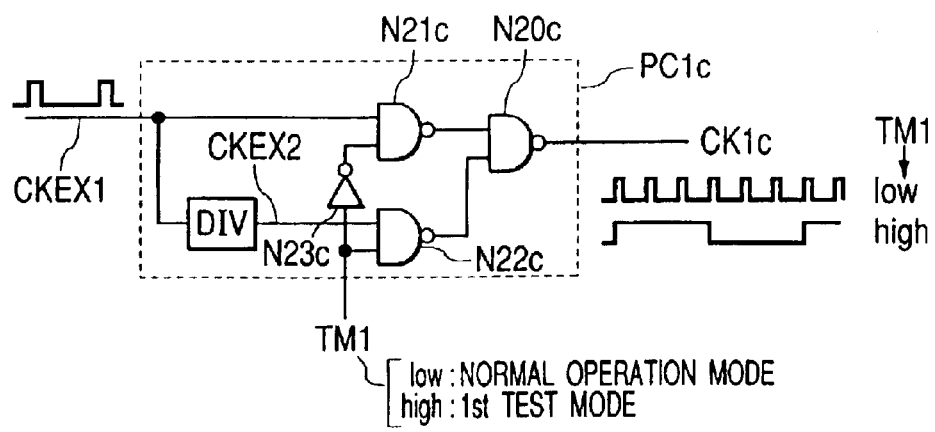
FIG. 7 is a logic circuit diagram showing a fifth preferred embodiment of the present invention.

Embodiment 5:

FIG. 7 shows a logic circuit in a fifth preferred embodiment of the present invention. In the fifth preferred embodiment, an external clock signal CKEX1 has an already shortened pulse width. An activation signal generator PC1c includes a frequency divider DIV for deriving a frequency-divided signal CKEX2 from the external clock signal CKEX1 and a selector comprising a plurality of logic elements N20c to N23c.

Figure 8:
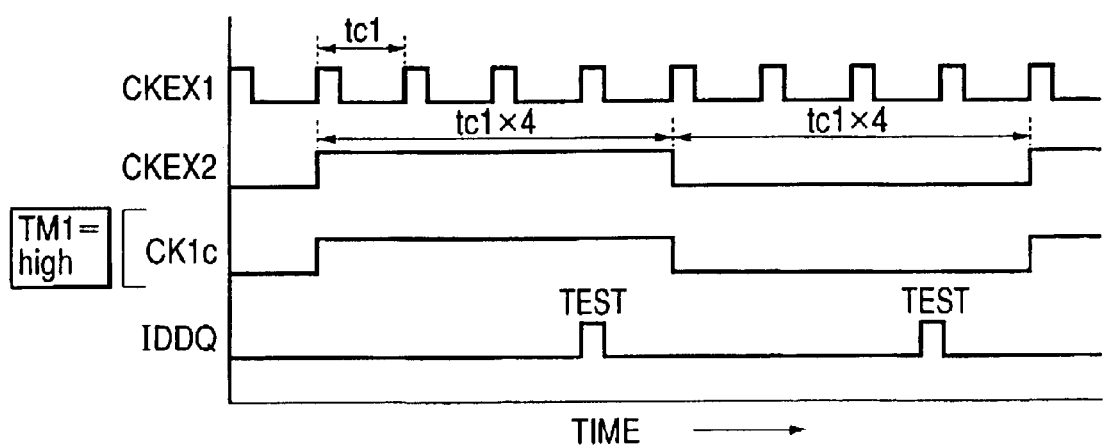
FIG. 8 is a signal timing chart in the fifth preferred embodiment of the present invention.

In a case where the frequency divider DIV outputs a frequency-divided signal of ⅛ of the input frequency, i.e., the polarity of the frequency-divided signal CKEX2 is reversed per every four cycles of the external clock signal CKEX1 as shown in the signal timing chart in FIG. 8. Hence, the pulse width of the frequency-divided signal CKEX2 varies depending on a cycle time tc1 of the external clock signal CKEX1. The external clock signal CKEX1 and the frequency-divided signal CKEX2 are fed to the selector comprising the logic elements N20c to N23c, and an output signal from the selector is derived as an activation signal CK1c using as the first test mode signal TM1.

In the fifth preferred embodiment, the frequency-divided signal CKEX2 is delivered as the activation signal CK1c at the time of diagnosis and failure analysis. While the frequency divider DIV performing ⅛ demultiplication is here, it will be apparent to those skilled in the art that a frequency divider performing other fractions, such as 1/m(m is an integer) demultiplication is applicable for providing similar operations.

Figure 9:
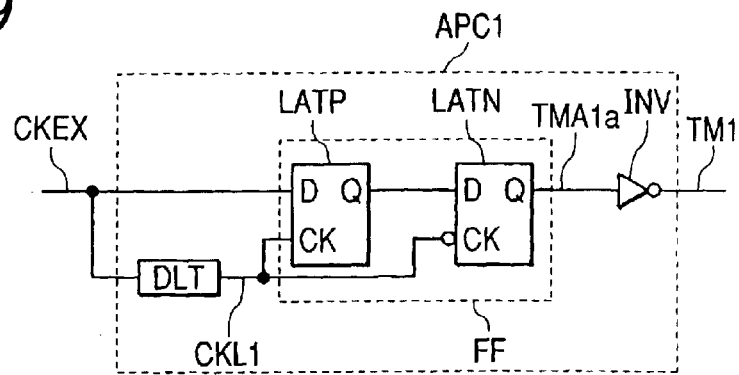
FIG. 9 is a logic circuit diagram showing a sixth preferred embodiment of the present invention.

Embodiment 6:

FIG. 9 shows a logic circuit in the sixth preferred embodiment of the present invention. In the sixth preferred embodiment, a test mode signal generator APC1 generates the first test mode signal TM1 automatically by detecting a cycle time length of the external clock signal CKEX. In general, it is impracticable to add a dedicated test-mode external input terminal to a general-purpose semiconductor integrated circuit having a standard input/output interface. Therefore, the dedicated test-mode external input terminal is not required where a test mode signal is automatically generated when the pulse width of an external clock signal is increased beyond a predetermined value. In other words, the invention realizes a semiconductor integrated circuit having a clock through mode function without modifying a standard input/output interface.

As shown in FIG. 9, the test mode signal generator APC1 in the sixth preferred embodiment includes a delay circuit DLT, a flip-flop circuit FF having a plurality of latch circuits LATP and LATN, and a signal inverter circuit INV. A signal CKL1 is a delayed signal of the external clock signal CKEX, and a signal TMA1a is an output signal from the flip-flop circuit FF. When the signal CKL1 is at a high potential, a signal input to a terminal D of the latch circuit LATP is output intact from a terminal Q thereof. When the signal CKL1 transits from a high potential to a low potential, a signal input to the terminal D is held at the terminal Q until the signal CKL1 reaches the high potential again. On the other hand, the latch circuit LATN performs similar operations to those of the latch circuit LATP when the signal CKL1 transits from the low potential to the high potential. Hence, the flip-flop circuit FF takes in the external clock signal CKEX when the signal CKL1 makes a high-to-low potential transition, and the flip-flop circuit FF outputs the thus taken-in signal as the signal TMA1a when the signal CKL1 makes a low-to-high potential transition.

FIG. 10 shows a signal timing chart of the sixth preferred embodiment. In this figure, "tc1" indicates a cycle time of the external clock signal CKEX in the normal operation mode, "tc2" indicates a cycle time of the external clock signal CKEX in the clock through mode, and "td" indicates a delay time of the signal CKL1 with respect to the external clock signal CKEX. This delay time is constant, i.e., invariable with the cycle time of the external clock signal CKEX.

Figure 10A:
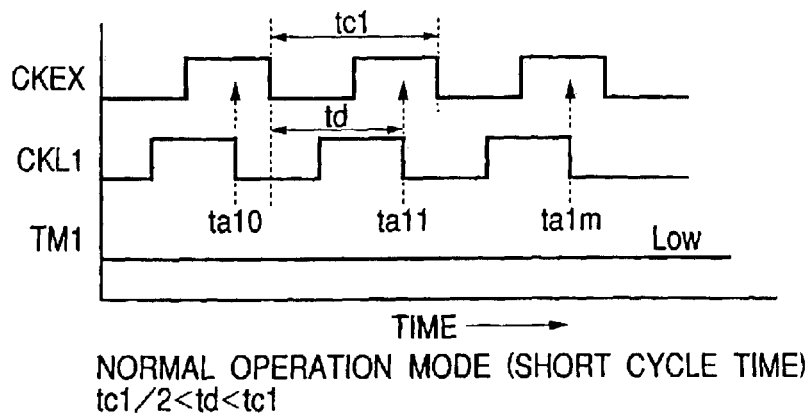
FIG. 10A and FIG. 10B are signal timing charts in the sixth preferred embodiment of the present invention.

The following describes a relationship among tc1, tc2 and td in operations in the sixth preferred embodiment. As shown in FIG. 10(a), the normal cycle time tc1 is used in the normal operation mode, in which a signal timing relationship of "tc1×½<td<tc1" is set up. Under this condition, the external clock signal CKEX is at a high potential whenever the signal CKL1 makes a high-to-low potential transition (timing points ta10 to ta1m). Therefore, the flip-flop circuit FF always takes in the signal CKL1 having a high potential to keep the signal TMA1a at a high potential. Thus, through the signal inverter circuit INV, the test mode signal TM1 remains at a low potential.

Figure 10B:
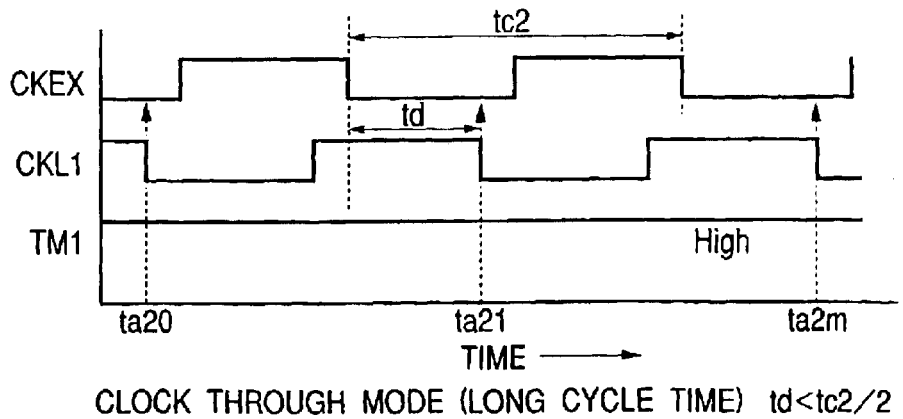

In contrast, as shown in FIG. 10(b), the cycle time tc2, which is longer than the normal cycle time tc1, is used in the clock through mode, in which a signal timing relationship of "td<tc2×½" is set up. Under this condition, the external clock signal CKEX is at a low potential whenever the signal CKL1 makes a high-to-low potential transition (timing points ta20 to ta2m). Therefore, the flip-flop circuit FF always takes in the signal CKL1 having a low potential to keep the signal TMA1a at a low potential. Thus, through the signal inverter circuit INV, the test mode signal TM1 remains at a high potential.

In the manner discussed above, by detecting a cycle time length of the external clock signal CKEX an automatic switch between the normal operation mode and the clock through mode is performed. Further, a modified arrangement is provided that a plurality of delay circuits DLT have different delay time periods td and that any one of these delay circuits DLT may be chosen. This modified arrangement allows selecting from a plurality of cycle time lengths for starting the clock through mode.

Figure 11:
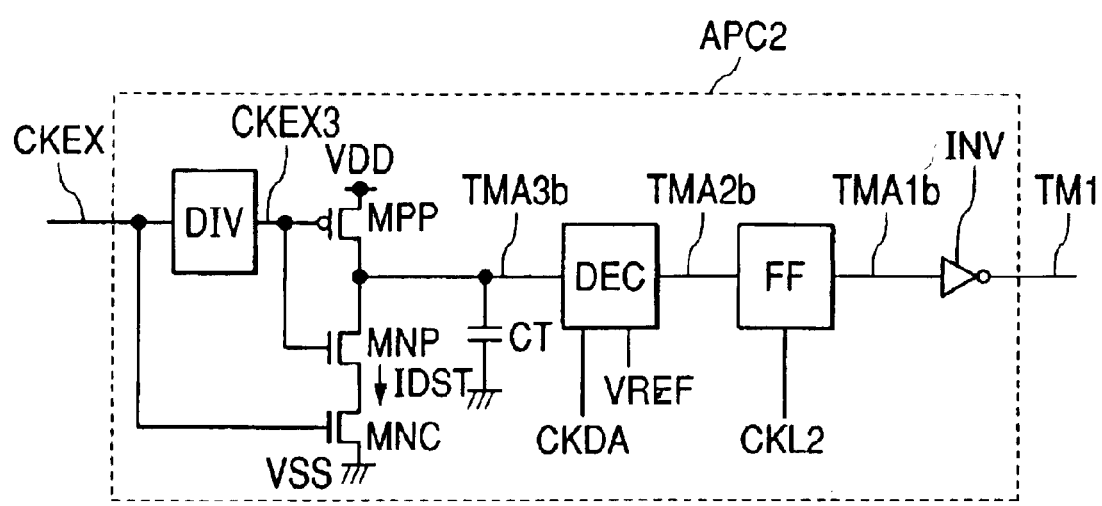
FIG. 11 is a logic circuit diagram showing a seventh preferred embodiment of the present invention.

Embodiment 7:

FIG. 11 shows a logic circuit in the seventh preferred embodiment of the present invention. The seventh preferred embodiment includes another test mode signal generator, wherein the pulse width range for a switch between the normal operation mode and the clock through mode is increased, and a wrong operation mode switch is unlikely to occur.

In the seventh preferred embodiment, a test mode signal automatic generator APC2 comprises a frequency divider DIV, a charging transistor MPP, discharging transistors MNP and MNC, a capacitor CT, a decision circuit DEC, a flip-flop circuit FF, and a signal inverter circuit INV. A signal CKEX3 is a frequency-divided signal having ⅛ frequency of the external clock signal CKEX. Signals TMA1b, TMA2b and TMA3b are internal signals. A signal CKDA is an activation signal for the decision circuit DEC, and a signal VREF is a reference voltage signal for the decision circuit DEC.

When the activation signal CKDA is at a high potential, the decision circuit DEC is made active. Then, if the signal TMA3b is at a potential lower than the reference potential VREF, the signal TMA2b having a low potential is outputted. If the signal TMA3b is at a potential higher than the reference potential VREF, the signal TMA2*b* having a high potential is outputted. When the activation signal CKDA is at a low potential, the decision circuit DEC is made inactive so as to output an undefined signal.

A signal CKL2 is an internal clock signal for the flip-flop circuit FF. A signal IDST is a discharge current from the capacitor CT. When the ⅛ frequency signal CKEX3 is at a low potential, the transistor MPP turns on and the transistor MNP turns off so as t charge the capacitor CT. When the ⅛ frequency signal CKEX3 is at a high potential and so does the external clock signal CKEX, the transistor MPP turns off and the transistors MNP and MNC turn on. Thus, the capacitor CT is discharged to provide the discharge current IDST. Hence, under the condition that the current drive power for the transistor MPP is set to a higher level and the current drive power for either or both of the transistors MNP and MNC is set to a lower level, it becomes possible to perform quick charging and slow discharging.

Figure 12A:
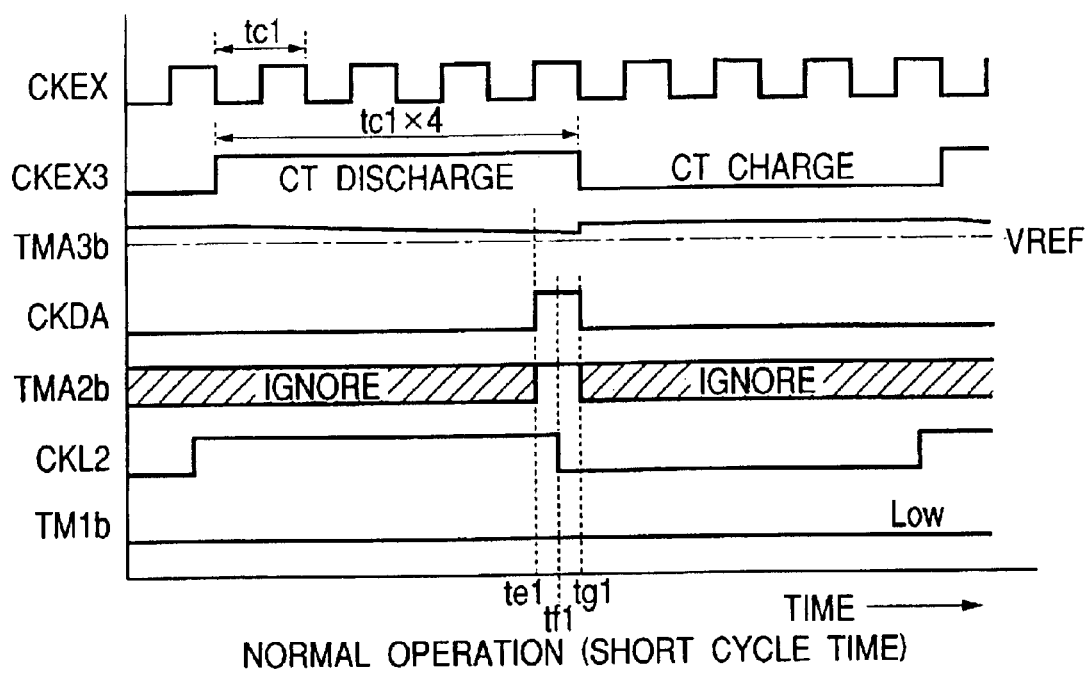
FIG. 12 is a signal timing chart in the seventh preferred embodiment of the present invention.
Figure 12B:
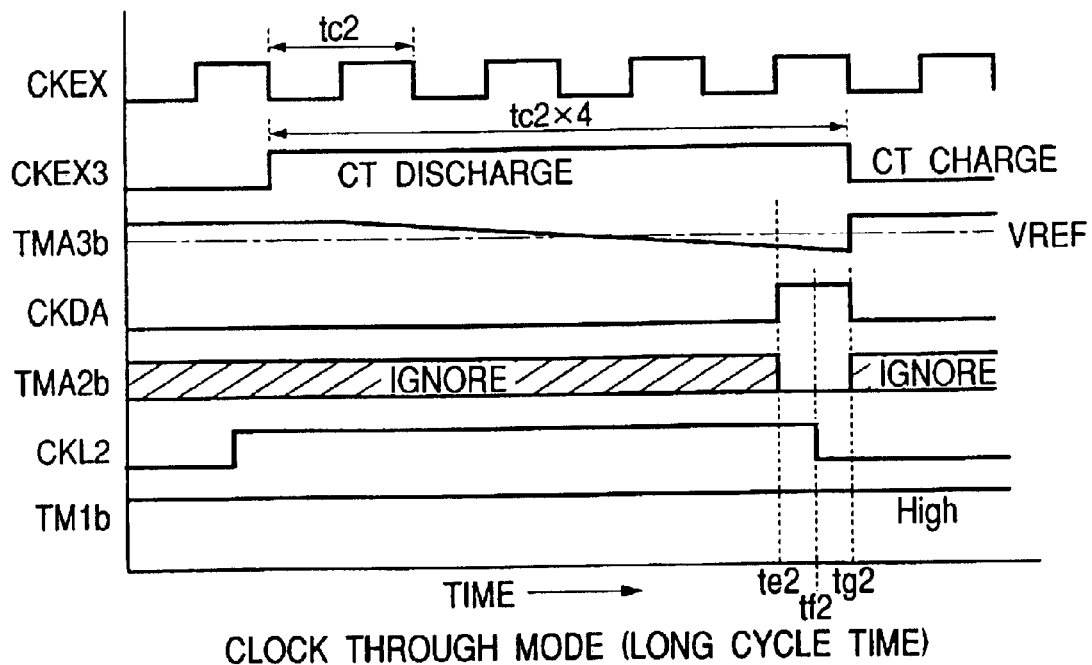

FIG. 12 shows a signal timing chart of the seventh preferred embodiment. In FIG. 12, "tc1" and "tc2" indicate cycle time lengths of the external clock signal CKEX, "te1" and "te2" indicate timing points for activating the decision circuit DEC, "tf1" and "tf2" indicate timing points at which the flip-flop circuit FF takes in the signal TMA2*b*, and "tg1" and "tg2" indicate timing points at which the decision circuit DEC is made inactive.

The following describes operations in the seventh preferred embodiment with reference to the signal timing chart shown in FIG. 12. In FIG. 12, the signal TMA3*b* is kept at a high potential when the signal CKEX3 is at a low potential, and the potential of the signal TMA3*b* decreases gradually when the signal CKEX3 is at a high potential. The degree of decrease in the potential of the signal TMA3*b* is determined by the discharge time of the capacitor CT, i.e., a total time period that the signal CKEX has a high potential while the signal CKEX3 is at a high potential. In the normal operation mode, since the cycle time tc1 is short and the duration that the signal CKEX has a high potential is also short, the potential of the signal TMA3*b* is higher than the reference potential VREF at the timing point te1 for activating the decision circuit DEC. Therefore, the signal TMA2*b* outputted from the decision circuit DEC reaches a high potential. Then, at the timing point tf1, the flip-flop circuit FF takes in the signal TMA2*b* having a high potential. At the timing point tg1 after the signal TMA2*b* is taken in the flip-flop circuit FF, the decision circuit DEC is made inactive and a ready state for the next activation is set up.

In the clock through mode, since the cycle time tc2 is long and the duration that the signal CKEX has a high potential is also long, the potential of the signal TMA3*b* is lower than the reference potential VREF at the timing point te2 for activating the decision circuit DEC. Therefore, the signal TMA2*b* outputted from the decision circuit DEC reaches a low potential. Then, at the timing point tf2, the flip-flop circuit FF takes in the signal TMA2*b* having a low potential. At the timing point tg2 after the signal TMA2*b* is taken in the flip-flop circuit FF, the decision circuit DEC is made inactive.

In activating the decision circuit DEC, a value of the potential of the signal TMA3*b* is calculated as below:

$$VDD-(IDST \times (tc\frac{1}{2}) \times 3)/CT = TMA3b$$

A cycle time at which a switch between the normal operation mode and the test mode is performed is expressed as follows:

$$VDD-(IDST \times (\text{Cycle time}/2) \times 3)/CT = VREF$$

$$\text{Cycle time} = ((VDD-VREF) \times 2 \times CT)/(3 \times IDST)$$

Accordingly, an arbitrary cycle time for the switch between the normal operation mode and the test mode can be set by a combination of an IDST current value, a CT capacitance value, and a VREF reference potential value.

Further, the discharging of the capacitor CT is made in three cycles. It is arguable that the capacitor CT discharges sufficiently in one or two cycles. In such arrangements, even if a pulse of a short cycle time is applied in the test mode, a switch to the normal operation mode does not take place. While the frequency divider DIV performing ⅛ demultiplication is used in the seventh preferred embodiment, it will be apparent to those skilled in the art that a frequency divider performing 1/m demultiplication is applicable for providing similar operations. Further, a modified arrangement may be provided, wherein a power supply VDD and a power supply VSS are swapped with each other, the transistor MPP is replaced with an NMOS-type transistor, and the transistors MNP and MNC are replaced with PMOS-type transistors. In addition, quick charging is performed while discharging is performed slowly and separately in time, and the number of signal inverter circuits is changed. It will be obvious to those skilled in the art that similar operations are allowed even in this modified arrangement.

Figure 13:
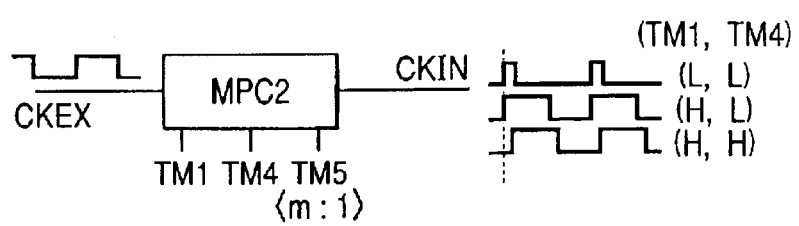
FIG. 13 is a block circuit diagram showing an eighth preferred embodiment of the present invention.

Embodiment 8:

FIG. 13 shows a block circuit diagram of the eighth preferred embodiment of the present invention. A commonly used arrangement is made for a signal which controls the pulse width of an internal activation signal in the normal operation mode and a signal which controls the timing of an internal activation signal in a fourth test mode. In FIG. 13, "MPC2" indicates an activation signal generator, "CKEX" indicates an external clock signal, and "CKIN" indicates an internal activation signal.

"TM1" indicates a first test mode signal used for controlling a switch between the normal operation mode and a first test mode (clock through mode). "TM4" indicates a fourth test mode signal for controlling a switch between the clock through mode and a fourth test mode. "TM5<m:1>" indicates "m" fifth test mode signals. In the normal operation mode, the "m" fifth test mode signals are used for regulating the pulse width of the signal CKIN over a range of "m" steps. In the fourth test mode, the "m" fifth test mode signals are used for regulating the timing (or delay timing) of the signal CKIN over a range of "m" steps. Thus, in comparison with an arrangement wherein respective control signals are provided for pulse width regulation and timing regulation, the number of control signals is reduced by "m" in the above-mentioned arrangement thereby decreasing the number of lines and the number of pins in a semiconductor integrated circuit.

Figure 14:
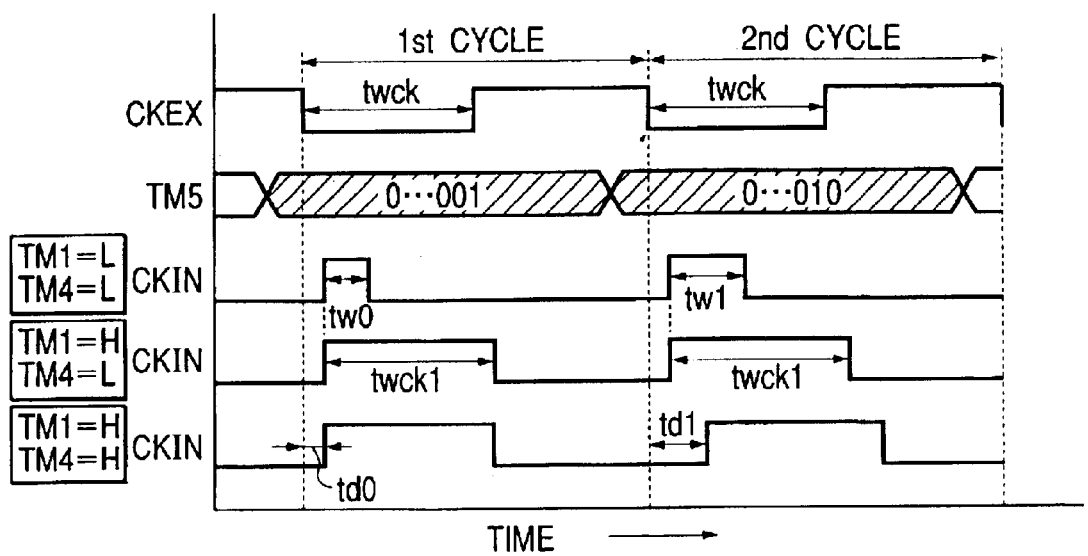
FIG. 14 is a signal timing chart in the eighth preferred embodiment of the present invention.

Referring to FIG. 14, there is shown a signal timing chart of the eighth preferred embodiment. The pulse width of the signal CKIN or the timing thereof (delay from CKEX) is set to the lowest level for a first cycle (TM5=0 . . . 001) and to the second lowest level for a second cycle (TM5=0 . . . 010). In the normal operation mode (TM1=L, TM4=L), the timing of the signal CKIN is constant, and the pulse width thereof is tw0 for the first cycle and tw1 (>tw0) for the second cycle based upon TM5. In the clock through mode (TM1=H, TM4=L), which also serves as a pulse width control mode, the timing of the signal CKIN is constant, and the pulse width thereof is twck1. The pulse width twck1 is approximately equal to the pulse width twck of the external clock signal CKEX and does not vary with the fifth test mode signal TM5. In the fourth test mode (TM1=H, TM4=H), which serves as a pulse delay (control mode), the pulse width twck1 of the signal CKIN is approximately equal to the pulse width twck of the external clock signal CKEX, and the delay timing of the signal CKIN is td0 for the first cycle and td1 (>td0) for the second cycle based upon TM5.

Figure 15:
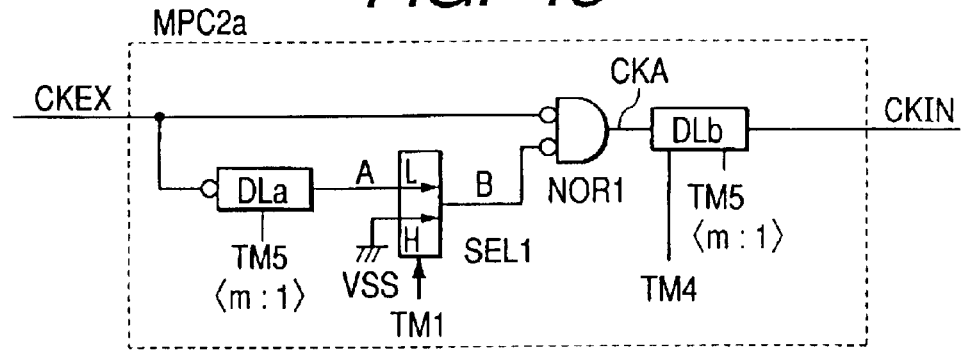
FIG. 15 is a logic circuit diagram showing a ninth preferred embodiment of the present invention.

Embodiment 9:

FIG. 15 shows an exemplary logic circuit configuration according to the ninth preferred embodiment of the present invention, which corresponds to the block circuit diagram in FIG. 13. In FIG. 15, "DLa" indicates a variable delay circuit for pulse width control. According to the signal TM5, the variable delay circuit DLa controls a delay time. "DLb" indicates a variable delay circuit for delay timing control. When the signal TM4 is low, the variable delay circuit DLb provides a constant delay time. When the signal TM4 is high, the variable delay circuit DLb is made active to control a delay time according to the signal TM5. "SEL1" indicates a two-input selector circuit, which selects one of two inputs according to the signal TM1.

Figure 16:
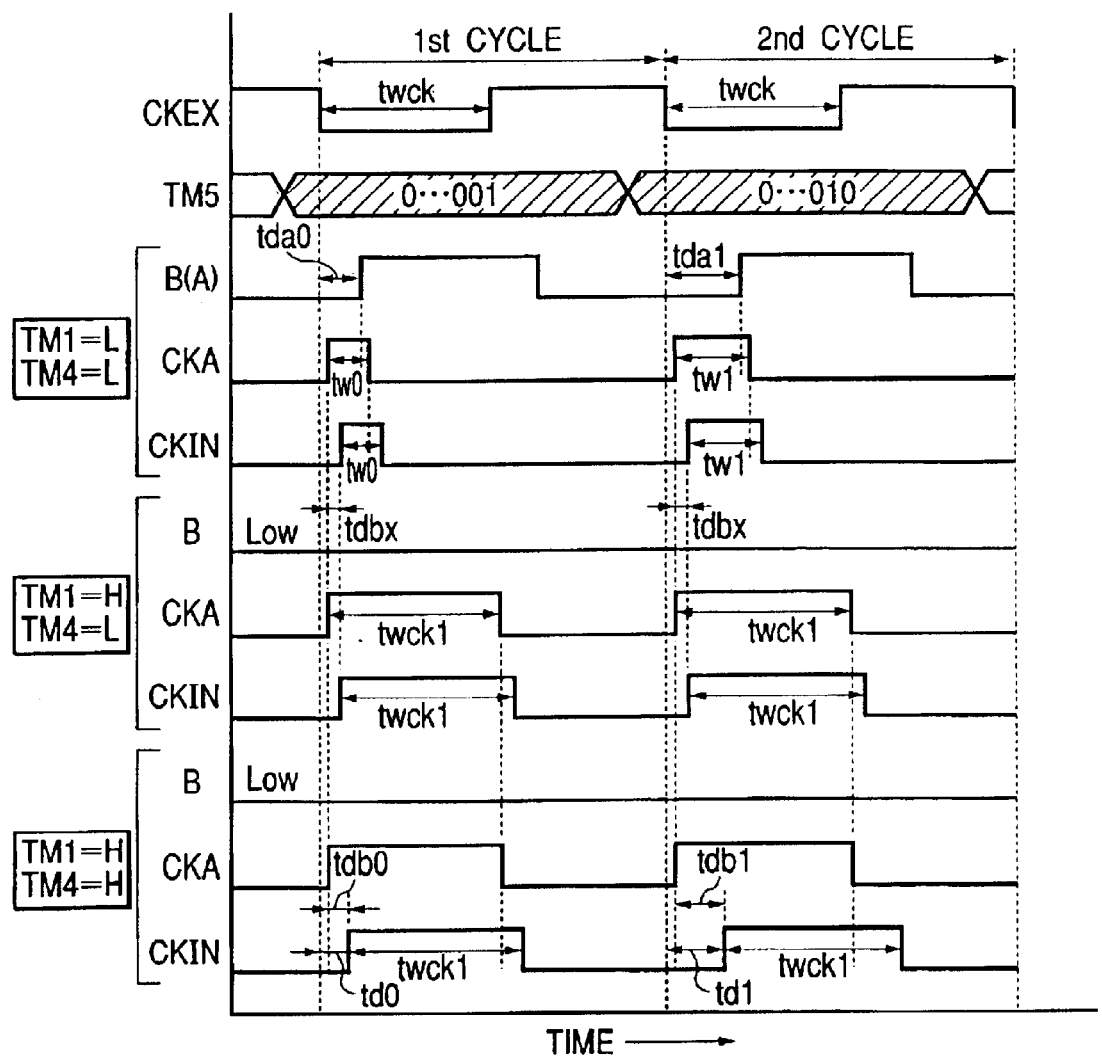
FIG. 16 is a signal timing chart in the ninth preferred embodiment of the present invention.

FIG. 16 shows a signal timing chart of the ninth preferred embodiment. In the normal operation mode (TM1=L, TM4=L), the selector circuit SEL1 selects an input signal A, and the variable delay circuit DLb provides a constant delay time tdbx. For the first cycle, the variable delay circuit DLa provides a delay time tda0. Using signals CKEX and B, a circuit NOR1 generates a signal CKA having a pulse width tw0 (approximately equal to tda0). Then, at the variable delay circuit DLb, the constant delay time tdbx is applied to the signal CKA, thus delivers a signal CKIN having a pulse width tw0. In the same manner, for the second cycle, the variable delay circuit DLa provides a delay time tda1 (>tda0), and a signal CKIN having a pulse width tw1 (approximately equal to tda1) is delivered from the variable delay circuit DLb.

In the clock through mode (TM1=H, TM4=L), the selector circuit SEL1 selects a low potential source signal VSS, and the variable delay circuit DLb provides the constant delay time tdbx. Therefore, regardless of the signal TM5, the circuit NOR1 generates a signal CKA having a pulse width twck1 (approximately equal to the pulse width twck of the external clock signal CKEX) for the first and second cycles. Then, the constant delay time tdbx is applied to the signal CKA to output a signal CKIN in the same timing sequence as that in the normal operation mode.

In the fourth test mode (TM1=H, TM4=H), the selector circuit SEL1 selects the low potential signal VSS. Therefore, for the first and second cycles, the circuit NOR1 generates a signal CKA having a pulse width twck1 regardless of the signal TM5. For the first cycle, the variable delay circuit DLb provides a delay time tdb0, thereby delivering a signal CKIN with a timing delay td0 (>tdb0) (delay from CKEX). In the same manner, for the second cycle, the variable delay circuit DLb provides a delay time tdb1 (>tdb0), so as to deliver a signal CKIN with a timing delay td1 (>td0).

Figure 17:
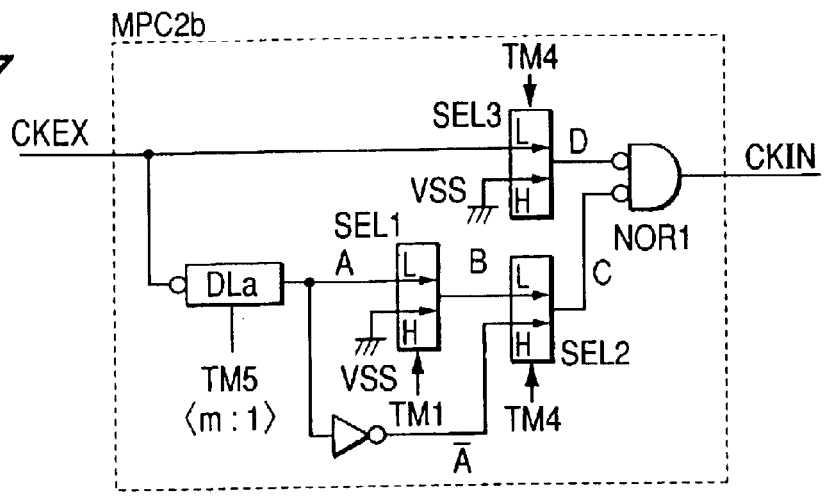
FIG. 17 is a logic circuit diagram showing a tenth preferred embodiment of the present invention.

Embodiment 10:

FIG. 17 shows an exemplary logic circuit configuration according to the tenth preferred embodiment of the present invention, which corresponds to the block circuit diagram in FIG. 13. A commonly used arrangement is made for variable delay circuits in addition to control signals. In FIG. 17, "DLa" indicates a variable delay circuit for pulse width control or delay timing control. According to the signal TM5, the variable delay circuit DLa controls a delay time. "SEL1", "SEL2" and "SEL3" indicate two-input selector circuits for selecting one of two inputs according to the signal TM1 or TM4. In the tenth preferred embodiment, one variable delay circuit is eliminated so as to the reduce required circuit area.

Figure 18:
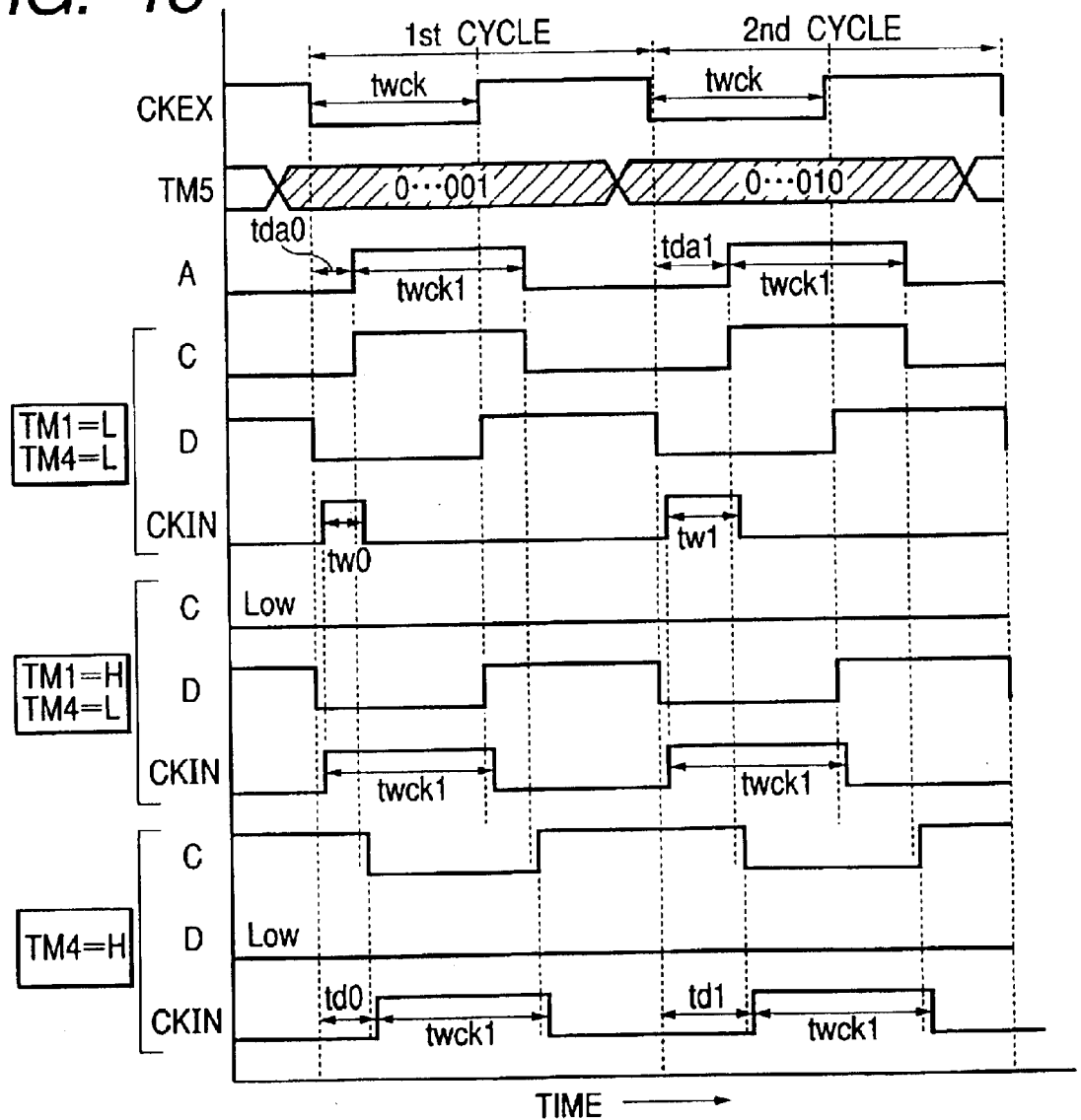
FIG. 18 is a signal timing chart in the tenth preferred embodiment of the present invention.

FIG. 18 shows a signal timing chart of the tenth preferred embodiment. In the normal operation mode (TM1=L, TM4=L), the selector circuit SEL1 selects an input signal A, the selector circuit SEL2 selects an input signal B, and the selector circuit SEL3 selects an input signal CKEX (external clock signal). For the first cycle, the variable delay circuit DLa provides a delay time tda0. With signals C and D, a circuit NOR1 outputs a signal CKIN having a pulse width tw0 (approximately equal to tda0). In the same manner, for the second cycle, the variable delay circuit DLa provides a delay time tda1 (>tda0), and the circuit NOR1 outputs a signal CKIN having a pulse width tw1 (approximately equal to tda1).

In the clock through mode (TM1=H, TM4=L), the selector circuit SEL1 selects a low potential source signal VSS, the selector circuit SEL2 selects the signal B, and the selector circuit SEL3 selects the signal CKEX. Therefore, regardless of a delay time provided by the variable delay circuit DLa, a CKIN signal having a pulse width twck1 (approximately equal to the pulse width twck of the external clock signal CKEX) is outputted in the same timing sequence as that in the normal operation mode.

In the fourth test mode (TM4=H), the selector circuit SEL2 selects a signal Â, and the selector circuit SEL3 selects the low potential source signal VSS. For the first cycle, the variable delay circuit DLa provides a delay time tda0, and the circuit NOR1 outputs a signal CKIN with a timing delay td0 (>tda0) (delay from CKEX). In the same manner, for the second cycle, the variable delay circuit DLa provides a delay time tda1 (>tda0), and the circuit NOR1 outputs a signal CKIN with a delay timing td1 (>tda1).

Figure 19:
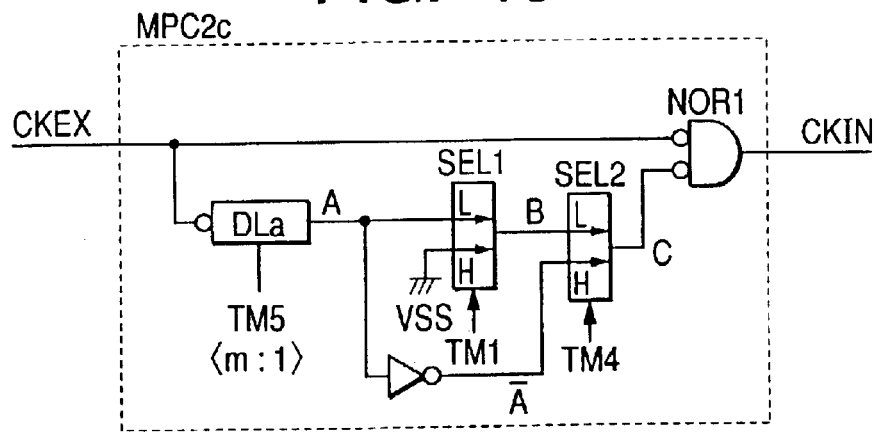
FIG. 19 is a logic circuit diagram showing an eleventh preferred embodiment of the present invention.

Embodiment 11:

FIG. 19 shows an exemplary logic circuit configuration according to the eleventh preferred embodiment of the present invention, which corresponds to the block circuit diagram in FIG. 13. A commonly used arrangement is made for variable delay circuits in addition to control signals. In FIG. 19, "DLa" indicates a variable delay circuit for pulse width control or delay timing control. According to the signal TM5, the variable delay circuit DLa controls a delay time. "SEL1" and "SEL2" indicate two-input selector circuits for selecting one of two inputs according to the signal TM1 or TM4. In the eleventh preferred embodiment, one variable delay circuit is eliminated so as to reduce the required circuit area.

Figure 20:
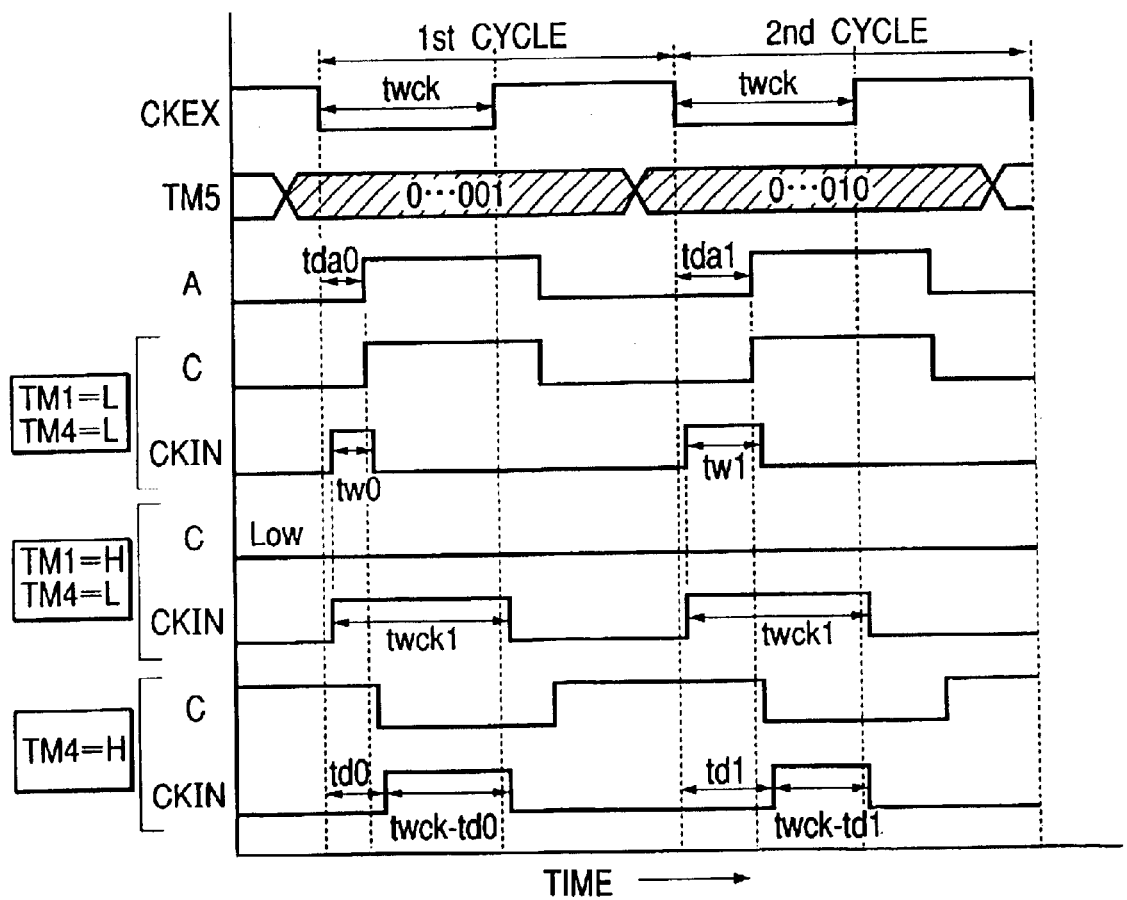
FIG. 20 is a signal timing chart in the eleventh preferred embodiment of the present invention.

FIG. 20 shows a signal timing chart of the eleventh preferred embodiment. In the normal operation mode (TM1=L, TM4=L), the selector circuit A selects an input signal A, and the selector circuit SEL2 selects an input signal B. For the first cycle, the variable delay circuit DLa provides a delay time tda0. Using signals CKEX and C, a circuit NOR1 outputs a signal CKIN having a pulse width tw0 (approximately equal to tda0). In the same manner, for the second cycle, the variable delay circuit DLa provides a delay time tda1 (>tda0), and the circuit NOR1 outputs a signal CKIN having a pulse width tw1 (approximately equal to tda1).

In the clock through mode (TM1=H, TM4=L), the selector circuit SEL1 selects a low potential source signal VSS, and the selector circuit SEL2 selects the signal B. Therefore, regardless of a delay time provided by the variable delay circuit DLa, a CKIN signal having a pulse width twck1 (approximately equal to the pulse width twck of the external clock signal CKEX) is output in the same timing sequence as that in the normal operation mode.

In the fourth test mode (TM4=H), the selector circuit SEL2 selects a signal Â. For the first cycle, the variable delay circuit DLa provides a delay time tda0, and using the signals CKEX and C, the circuit NOR1 outputs a signal CKIN having a pulse width twck−td0 with a timing delay td0 (>tda0) (delay from CKEX). In the same manner, for the second cycle, the variable delay circuit DLa provides a delay time tda1 (>tda0), and the circuit NOR1 outputs a signal CKIN having a pulse width twck−td1 with a delay timing td1 (>tda1).

Figure 21:
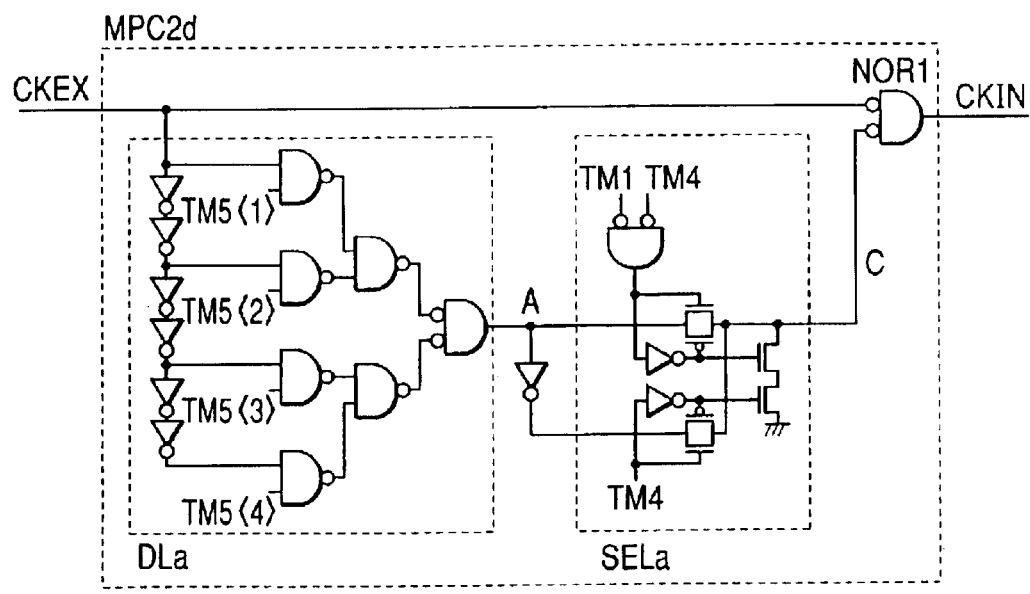
FIG. 21 is a logic circuit diagram showing a twelfth preferred embodiment of the present invention.

Embodiment 12:

FIG. 21 shows a specific example of a logic circuit configuration according to the twelfth preferred embodiment of the present invention, which corresponds to the logic circuit diagram in FIG. 19. In FIG. 21, "DLa" indicates a variable delay circuit for performing four-step control according to the signal TM5<4:1>, and "SELa" indicates a selector circuit equivalent to "SEL1+SEL2" shown in FIG. 19. In the normal operation mode, four pulse width steps are selectable for a signal CKIN. In the clock through mode, a signal CKIN having a pulse width twck1 can be outputted in the same timing sequence as in the normal operation mode. Further, in the fourth test mode, four timing steps are selectable for a signal CKIN on condition that "timing delay (delay from CKEX)+pulse width" is kept approximately equal to twck.

Figure 22:
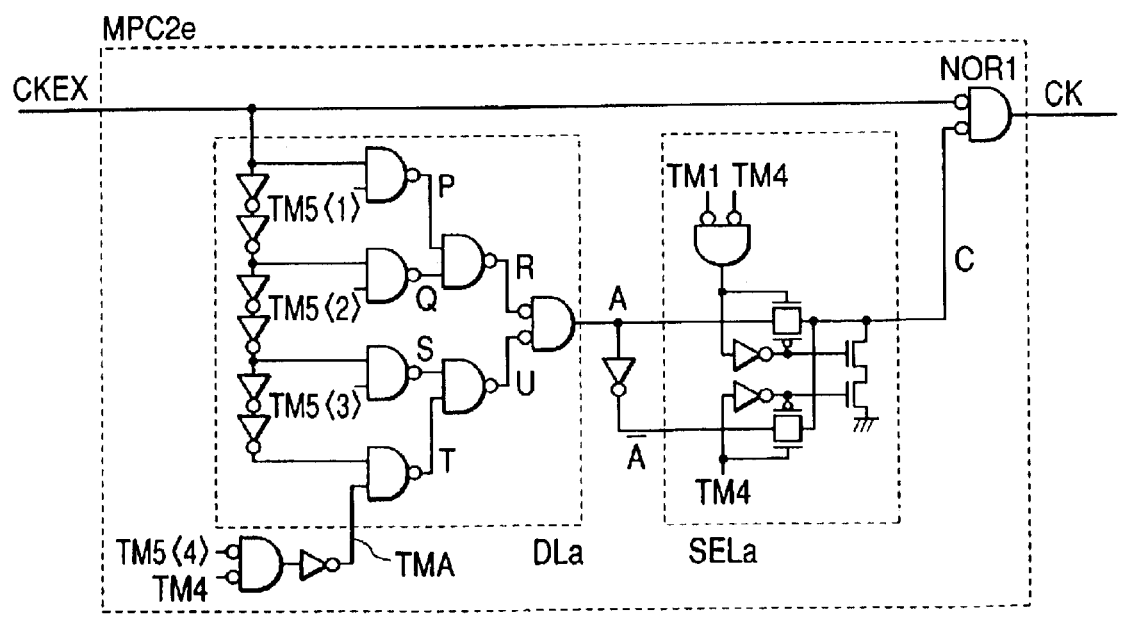
FIG. 22 is a logic circuit diagram showing a thirteenth preferred embodiment of the present invention.

Embodiment 13:

FIG. 22 shows another specific example of a logic circuit configuration according to the thirteenth preferred embodiment of the present invention, which is similar to the arrangement in FIG. 21. The thirteen preferred embodiment differs from the twelfth preferred embodiment in that a maximum timing value (TM5=1000) is provided by default regardless of a set value of TM5 in the fourth test mode.

Figure 23:
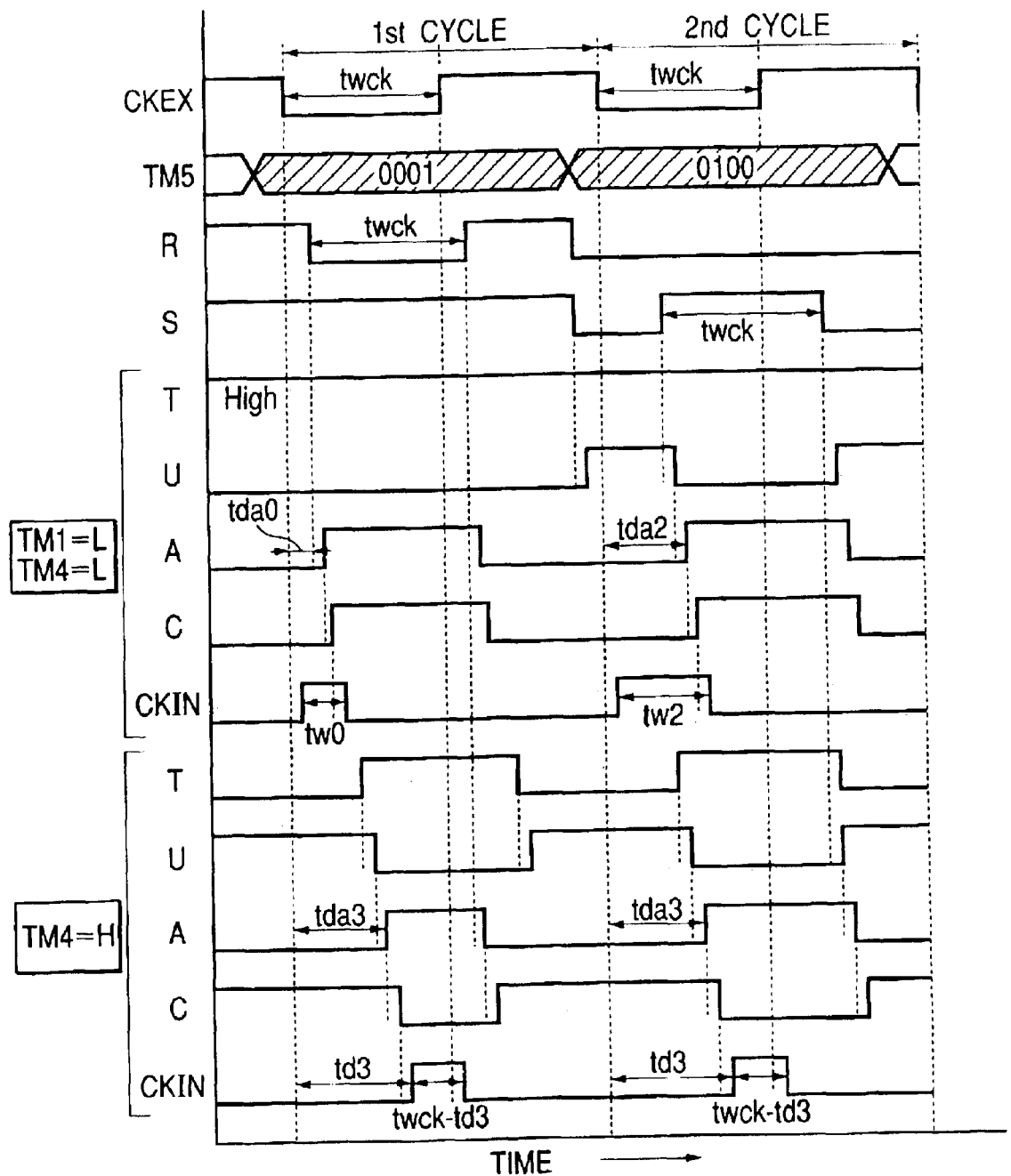
FIG. 23 is a signal timing chart in the thirteenth preferred embodiment of the present invention.
Figure 24:
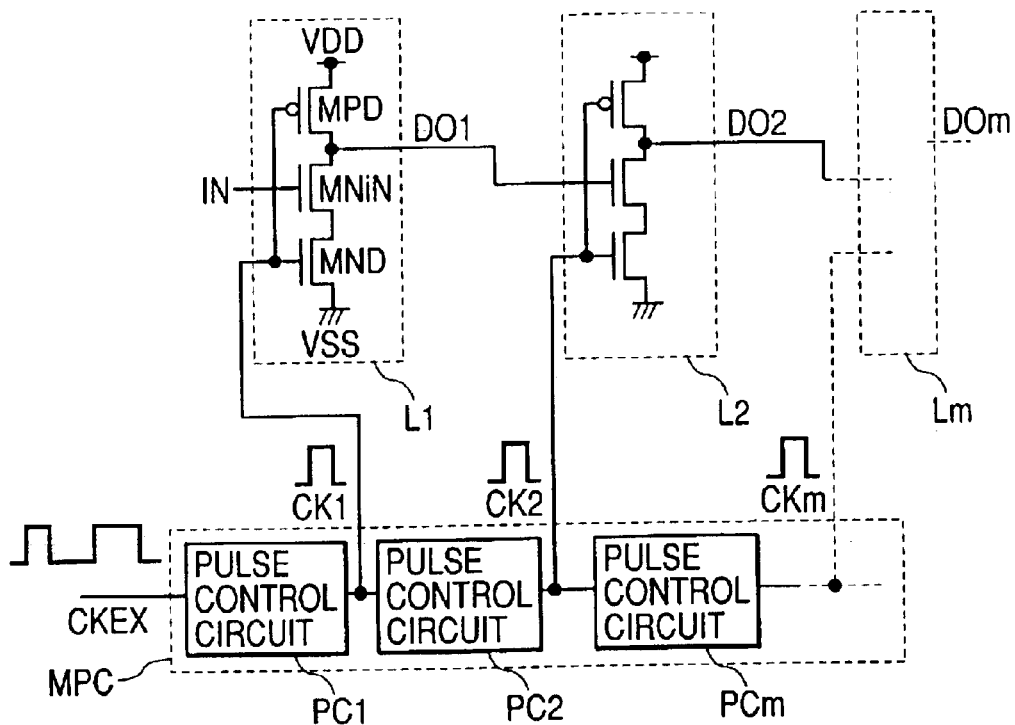
FIG. 24 is a circuit diagram showing an example of a conventional semiconductor integrated circuit.

FIG. 23 shows a signal timing chart of the thirteenth preferred embodiment. In the normal operation mode (TM1=L, TM4=L), the selector circuit SELa selects an input signal A. For the first cycle (TM5=0001), the signal CKEX is fed through P and R in the variable delay circuit DLa, resulting in a signal A having a delay tda0. Thus, using signals CKEX and C, the circuit NOR1 outputs a signal CKIN having a pulse width two (approximately equal to tda0). In the same manner, for the second cycle (TM=0100), the signal CKEX is fed through S and U in the variable delay circuit DLa, resulting in a signal A having a delay tda2. Thus, the circuit NOR1 outputs a signal CKIN having a pulse width tw2 (approximately equal to tda2).

In the clock through mode (TM1=H, TM4=L), the selector circuit SELa selects a low potential source signal VSS. Therefore, regardless of a delay time provided by the variable delay circuit DLa, a signal CKIN having a pulse width twck1 is outputted in the same timing sequence as that in the normal operation mode (as in the case of the twelfth preferred embodiment).

In the fourth test mode (TM4=H), a signal TMA goes high and the selector circuit SELa selects a signal Â. For the first cycle, a negative pulse appears at R and U in the variable delay circuit DLa. Through a logical NOR operation on R and U, a signal having a delay tda3 is outputted since a delay of U is longer than that of R. Thus, using signals CKEX and C, the circuit NOR1 outputs a signal CKIN having a pulse width twck−td3 with a delay timing td3 (>tda3) (delay from CKEX). For the second cycle, a positive pulse appears at S and T in the variable delay circuit DLa. Through a logical NAND operation on S and T, a delay of U is determined by T since a delay of T is longer than that of S. Further, through a logical NOR operation on R (=L) and U. a signal A having a delay tda3 is output. Therefore, the circuit NOR1 outputs a signal CKIN having a pulse width twck−td3 with a delay timing td3 (>tda3) (delay from CKEX) as in the first cycle.

As set forth hereinabove and according to the present invention, an evaluation period as well as a precharge period is increased with a length of an operation cycle time in a test mode. Therefore, during the precharge period and the evaluation period, an internal node can be put in a completely quiescent state, i.e., a pause phase, thereby making it possible to conduct an IDDQ test and a light detection test. Therefore, diagnosis and failure analysis can be carried out easily and with high accuracy such that the time required for designing a semiconductor integrated circuit is reduced.

The above-mentioned embodiments implement a method for testing a semiconductor integrated circuit comprising the steps of providing at least one internal activation signal generator; generating by the signal generator at least one internal activation signal thereby controlling active/inactive operations of at least one internal circuit when the reference signal is set in a normal operation mode, the internal activation signal having pulses of a constant pulse width invariable with a first cycle time length of a reference signal; and selectively switching the signal generator to generate a first test signal having a pulse width varying with a second cycle time length of the reference signal, and testing the internal circuit with the first test signal.

The method for testing a semiconductor integrated circuit may be carried out by software or hardware. Such a computer program product for testing a semiconductor integrated circuit comprises a module for generating by a internal activation signal generator at least one internal activation signal thereby controlling active/inactive operations of at least one internal circuit when the reference signal is set in a normal operation mode, the internal activation signal having pulses of a constant pulse width invariable with a first cycle time length of a reference signal; and a module for selectively switching the signal generator to generate a first test signal having a pulse width varying with a second cycle time length of the reference signal, and for testing the internal circuit with the first test signal. And such an apparatus for testing a semiconductor integrated circuit comprises at least one internal activation signal generator which includes means for generating by the signal generator at least one internal activation signal thereby controlling active/inactive operations of at least one internal circuit when the reference signal is set in a normal operation mode, the internal activation signal having pulses of a constant pulse width invariable with a first cycle time length of a reference signal; and means for selectively switching the signal generator to generate a first test signal having a pulse width varying with a second cycle time length of the reference signal, and for testing the internal circuit with the first test signal.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for testing a semiconductor integrated circuit which includes an internal activation signal generator and at least an internal circuit, the method comprising steps of:

supplying said signal generator under a normal operation mode with an external clock signal thereby providing said internal circuit with an activation signal for normal operation having pulses of a constant pulse width invariable with a cycle time length of said external clock signal from said signal generator; and supplying said signal generator under a test mode with external clock signal thereby providing said internal circuit with an activation signal for test mode operation having a pulse width varying with the cycle time length of said external clock from said signal generator.

2. A method for testing a semiconductor integrated circuit according to claim 1 wherein the cycle time length of said external clock signal is changed between said normal operation mode and said test mode.

3. A method for testing integrated circuit according to claim 1 wherein the operation mode of said signal generator is changed between said normal operation mode and said test mode in responsive to said cycle time length of said external clock signal.

* * * * *